United States Patent
Yonemura et al.

(10) Patent No.: US 9,548,406 B2
(45) Date of Patent: Jan. 17, 2017

(54) PHOTOELECTRIC CONVERSION ELEMENT AND METHOD OF MANUFACTURING THE SAME

(71) Applicant: Seiko Epson Corporation, Tokyo (JP)

(72) Inventors: Takayuki Yonemura, Suwa (JP); Yoshihiko Yokoyama, Chino (JP); Yasuaki Hamada, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/496,364

(22) Filed: Sep. 25, 2014

(65) Prior Publication Data

US 2015/0084151 A1    Mar. 26, 2015

(30) Foreign Application Priority Data

Sep. 26, 2013    (JP) .................................. 2013-200462

(51) Int. Cl.

| | |
|---|---|
| *H01L 31/032* | (2006.01) |
| *H01L 31/07* | (2012.01) |
| *H01L 31/072* | (2012.01) |
| *H01L 31/108* | (2006.01) |
| *H01L 31/109* | (2006.01) |
| *C04B 35/26* | (2006.01) |

(52) U.S. Cl.
CPC ............. *H01L 31/032* (2013.01); *C04B 35/26* (2013.01); *H01L 31/07* (2013.01); *H01L 31/072* (2013.01); *H01L 31/109* (2013.01); *H01L 31/1085* (2013.01); *C04B 2235/3227* (2013.01); *C04B 2235/3232* (2013.01); *C04B 2235/3262* (2013.01); *C04B 2235/3298* (2013.01); *C04B 2235/449* (2013.01); *Y02E 10/50* (2013.01)

(58) Field of Classification Search
CPC ....... H01L 31/032; H01L 31/103; H01L 31/18
See application file for complete search history.

(56) References Cited

U.S. PATENT DOCUMENTS 4,921,328 A * 5/1990 Seth ...................... C03C 13/008
                                                        385/141
5,458,986 A * 10/1995 Wilber et al. ................. 428/697
(Continued)

FOREIGN PATENT DOCUMENTS

JP        2011-100845 A       5/2011

OTHER PUBLICATIONS

W. Sakamoto et al., "Fabrication and Photo-Induced Properties of Al-Doped ZnO/BiFeO$_3$ Thin Films by Chemical Solution Deposition," Proceedings of the 32nd Meeting on Ferroelectric Materials and Their Applications, Organizing Committee of Conference of the Applications of Ferroelectrics, pp. 13-14 (May 20, 2015).

(Continued)

*Primary Examiner* — Marc Armand
*Assistant Examiner* — Sue Tang
(74) *Attorney, Agent, or Firm* — Harness, Dickey & Pierce, P.L.C.

(57) ABSTRACT

A photoelectric conversion element includes a first electrode, a ferroelectric layer provided on the first electrode, and a second electrode provided on the ferroelectric layer, the second electrode being a transparent electrode, and a pn junction being formed between the ferroelectric layer and the first electrode or the second electrode.

8 Claims, 7 Drawing Sheets

(56) References Cited

U.S. PATENT DOCUMENTS

| | | | |
|---|---|---|---|
| 2008/0302658 A1* | 12/2008 | Sasaki | B41J 2/14233 204/400 |
| 2011/0149633 A1* | 6/2011 | Ahn et al. | 365/145 |
| 2011/0164097 A1* | 7/2011 | Nawano | B41J 2/055 347/71 |
| 2011/0228014 A1* | 9/2011 | Takahashi | B41J 2/14233 347/68 |
| 2012/0217494 A1 | 8/2012 | Okino et al. | |
| 2012/0281451 A1* | 11/2012 | Jiang et al. | 365/145 |

OTHER PUBLICATIONS

H. Matsuo et al., "Photovoltaic effect in BiFeO3 Ferroelectric Thin Film/Electrode Interfaces," Proceedings of the 32nd Meeting on Ferroelectric Materials and Their Applications, Organizing Committee of Conference of the Applications of Ferroelectrics, pp. 121-122 (May 20, 2015).

* cited by examiner

PHOTOELECTRIC CONVERSION ELEMENT AND METHOD OF MANUFACTURING THE SAME

BACKGROUND

1. Technical Field

The present invention relates to a photoelectric conversion element and a method of manufacturing the same.

2. Related Art

In the related art, it is known that it is possible to obtain a current (a photoelectric current) due to excitation of electrons (an internal photoelectric effect) when light is irradiated onto a semiconductor layer where a plurality of semiconductors with different carrier types are bonded. As elements which use this effect, there are photoelectric conversion elements, which are widely used in photovoltaics including solar power generation, optical sensing systems which use optical detectors, and the like. As representative examples of photoelectric conversion elements, there are pn junction photodiodes which bond a p-type semiconductor and an n-type semiconductor, and these are used as solar panels which use silicon (Si) substrates as the n-type semiconductor, optical detectors in CMOS image sensors which are a type of MOS structure semiconductor, and the like.

There are times when a reverse bias is applied in such photoelectric conversion elements in order to improve responsiveness with respect to the illuminance of light. Due to this, capacitance is reduced by a depletion layer, which is formed in the vicinity of the pn junction, expanding and electrical output with high linearity is obtained with respect to the illuminance of light; however, it is known that it is easy for a current (a dark current), which leaks under conditions where light is not irradiated, to increase under the operation conditions of reverse bias. In such a case, since noise which is caused by the dark current is generated and the lower limit of the minimum value of the output signal is within the noise, the range of the detection values which are able to be distinguished is narrowed and efficient photoelectric conversion is difficult.

In order to suppress the dark current, there is proposed a back-illuminated type solid-state imaging apparatus which has a wiring layer which is formed on a semiconductor substrate and a light receiving section which photoelectrically converts incident light from the opposite side to the wiring layer, where a spontaneous polarization film formed of a material which polarizes spontaneously is formed on a light receiving surface of the light receiving section formed of a pn junction photodiode or the like (for example, refer to JP-A-2011-100845). In this apparatus, it is possible to suppress noise current by polarizing the spontaneous polarization film and forming a hole accumulation layer where positive holes are induced in the light receiving surface side.

However, in JP-A-2011-100845, the light receiving section is merely a typical electron element which has a photoelectric conversion function and does not have any special characteristics. Then, since the configuration where a spontaneous polarization film is provided on the light receiving section or a series of processes are necessary, it is difficult to achieve diversification and it is difficult to use the apparatus in a wide range of applications.

SUMMARY

An advantage of some aspects of the invention is to provide a photoelectric conversion element where efficient photoelectric conversion is possible and which is able to be used in a wide range of applications and a method of manufacturing the same.

According to an aspect of the invention, there is provided a photoelectric conversion element including a first electrode, a ferroelectric layer provided on the first electrode, and a second electrode provided on the ferroelectric layer, where the second electrode is a transparent electrode, and a pn junction is formed between the ferroelectric layer and the first electrode or the second electrode.

In this aspect, since the pn junction is formed between the ferroelectric layer and the first electrode or the second electrode, the ferroelectric layer has both a satisfactory ferroelectric characteristic and a satisfactory pn junction diode characteristic. Due to this, it is possible to change the polarization direction and to change the pn junction diode characteristic using the ferroelectric characteristic of the ferroelectric layer, and efficient photoelectric conversion is possible according to the polarization direction of the induced dipole of the ferroelectric layer. Moreover, in this aspect, since the ferroelectric layer has both a satisfactory ferroelectric characteristic and a satisfactory pn junction diode characteristic, it is possible to provide a photoelectric conversion element which is able to be used in a wide range of applications.

Here, it is preferable that the ferroelectric layer be a p-type semiconductor. Due to this, it is possible to configure the second electrode as an n-type semiconductor and to form a pn junction. Thus, efficient photoelectric conversion is possible using, for example, a transparent electrode (ITO) where the main component is indium tin oxide which is an n-type semiconductor as the second electrode, and it is possible to provide a photoelectric conversion element which is able to be used in a wide range of applications.

In addition, it is preferable that the induced dipole of the ferroelectric layer be polarized in an orientation in which a positive charge is induced on the second electrode side. Due to this, in a case where the ferroelectric layer is configured as a p-type semiconductor, it is possible to improve the efficiency of the photoelectric conversion since the width of the depletion layer is expanded and the responsiveness with respect to the illuminance of light is improved.

In addition, it is preferable that a circuit be provided which polarizes the induced dipole of the ferroelectric layer in a predetermined direction by applying a polarization voltage to the ferroelectric layer. Due to this, it is possible to apply a polarization voltage to the ferroelectric layer as necessary. Thus, as well as efficient photoelectric conversion being possible, for example, it is easy to apply the polarization voltage to the ferroelectric layer at desired intervals and reliably set the ferroelectric layer to a ferroelectric state or to adjust the polarization voltage which is applied and appropriately change the polarization direction of the induced dipole of the ferroelectric layer. As a result, it is easy for the photoelectric conversion element to be used in a wide range of applications.

In addition, it is preferable that the ferroelectric layer include bismuth (Bi) and iron (Fe). Due to this, it is possible to configure the ferroelectric layer as a composite oxide with a perovskite structure which contains, for example, bismuth (Bi) and iron (Fe). Due to this, efficient photoelectric conversion is possible, and it is possible to provide a photoelectric conversion element which is able to be used in a wide range of applications and which is able to reduce a burden on the environment using a ferroelectric layer which does not include lead.

In addition, it is preferable that the ferroelectric layer include at least one type which is selected from a group consisting of lanthanum (La), manganese (Mn), and titanium (Ti). Due to this, the photoelectric conversion function is improved and more efficient photoelectric conversion is possible. In addition, the degree of freedom in the material which configures the ferroelectric layer also increases and it is easy for the photoelectric conversion element to be used in a wide range of applications.

According to another aspect of the invention, there is provided a method of manufacturing a photoelectric conversion element including laminating a first electrode, a ferroelectric layer, and a second electrode which is a transparent electrode, and forming a pn junction between the ferroelectric layer and the first electrode or the second electrode.

In this aspect, since the ferroelectric layer has both a satisfactory ferroelectric characteristic and a satisfactory pn junction diode characteristic, it is possible to change the polarization direction using the ferroelectric characteristic of the ferroelectric layer and to change the pn junction diode characteristic, and efficient photoelectric conversion is possible according to the polarization direction of the induced dipole of the ferroelectric layer. Moreover, since the ferroelectric layer in this aspect has both a satisfactory ferroelectric characteristic and a satisfactory pn junction diode characteristic, it is possible to manufacture a photoelectric conversion element which is able to be used in a wide range of applications.

BRIEF DESCRIPTION OF THE DRAWINGS

Embodiments of the invention will now be described by way of example only with reference to the accompanying drawings, wherein like numbers reference like elements.

FIGS. 1A and 1B are diagrams which show a schematic configuration of a photoelectric conversion element according to Embodiment 1.

DESCRIPTION OF EXEMPLARY EMBODIMENTS

Embodiment 1

Figure 1B:
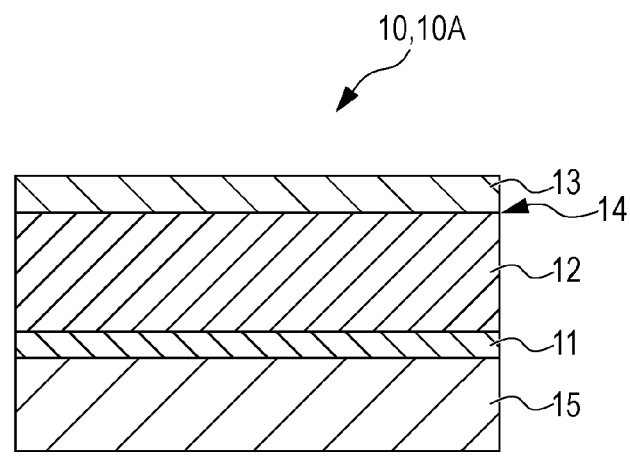
Figure 1B:
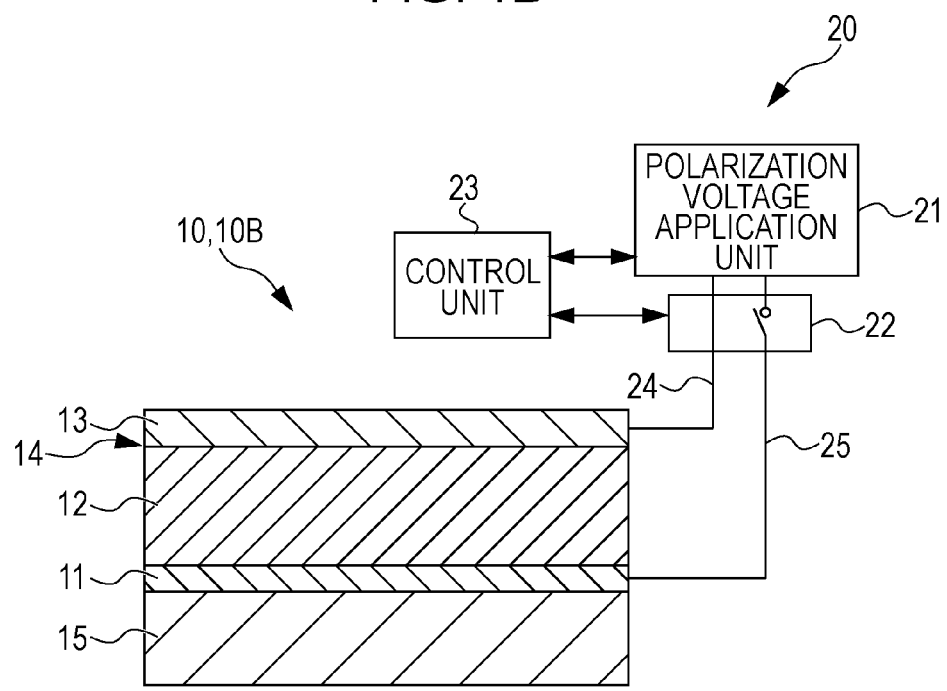

FIGS. 1A and 1B are diagrams which show a schematic configuration of a photoelectric conversion element according to Embodiment 1 of the invention.

As shown in the diagram, a photoelectric conversion element 10 is provided with a first electrode 11, a ferroelectric layer 12 which is provided on the first electrode, and a second electrode 13 which is provided on the ferroelectric layer 12, where the second electrode 13 is a transparent electrode, and a pn junction 14 is formed between the ferroelectric layer 12 and the second electrode 13.

That is, the present embodiment focuses on the point that it is possible to change the pn junction diode characteristic by changing the polarization direction of the induced dipole of the ferroelectric layer 12 (abbreviated below as simply "polarization of the ferroelectric layer") by using the ferroelectric characteristic of the ferroelectric layer 12.

Here, the ferroelectric characteristic refers to typical characteristics of a ferroelectric body. For example, the ferroelectric characteristic is a characteristic of undergoing spontaneous polarization due to the aligning of the electric dipole due to the application of a polarization voltage, and changing the direction of this spontaneous polarization according to an electric field.

In addition, the pn junction diode characteristic refers to typical characteristics of a photodiode which has a pn junction diode or a pn junction structure. For example, the pn junction diode characteristic refers to a characteristic where a region which has reduced carriers (a depletion layer) is formed in the vicinity of the pn junction 14 and it is possible to excite electrons by the irradiation of light to obtain a photoelectric current.

The first electrode 11, the ferroelectric layer 12, and the second electrode 13 are laminated on a substrate 15 in this order. For the substrate 15, it is possible to use, for example, a silicon (Si) substrate or a glass substrate without being limited to these examples. Although not illustrated in FIGS. 1A and 1B, a desired insulation layer or adhesion layer may be provided between the substrate 15 and the first electrode 11.

Any material which has conductivity may be used for the first electrode 11, and it is possible to configure the first electrode 11 using metal elements such as platinum (Pt), iridium (Ir), gold (Au), aluminum (Al), copper (Cu), titanium (Ti) stainless steel, and the like, or using conductive polymers or the like. The first electrode 11 may be configured by laminating a plurality of metal layers or metal oxide layers. In this manner, it is possible to form the first electrode 11, for example, in a layered form or in a thin film form; however, the configuration described above is not limited within a range which does not depart from the scope of the invention.

On the other hand, the second electrode 13 is configured as a transparent electrode. Due to this, light which is irradiated from the second electrode 13 side is transmitted such that the light is incident onto the ferroelectric layer 12 which forms the pn junction 14 with the second electrode 13. In this manner, the second electrode 13 is changed according to the material of the ferroelectric layer 12; however, it is possible for the second electrode 13 to be configured as a transparent electrode (ITO) where, for example, the main component is indium oxide ($In_2O_3$) where a certain percentage of tin is added. It is known that the transparent electrode (ITO) functions as an n-type semiconductor.

It is not necessary for the second electrode 13 to be completely optically transparent, only to be substantially transparent. Thus, in the present specification, the second electrode 13 has a transmission rate where light is transmitted through the second electrode 13 and reaches the pn junction 14 when the second electrode 13 is the surface where light is incident.

When the film thickness of the second electrode 13 is increased, conductivity is improved since the carrier density is increased. On the other hand, the transmission rate tends to decrease since the transmission distance for the light to reach the pn junction 14 is lengthened. Due to this, it is preferable that the film thickness of the second electrode 13 be appropriately selected in consideration of the conductivity, the transmission rate, and the like, according to the application, the strength, and the like. It is possible for the form of the second electrode 13 to be a layered form or a thin film form in the same manner as the first electrode 11; however, the shape is not limited within a range which does not depart from the scope of the invention.

In this manner, the ferroelectric layer 12 which is provided between the first electrode 11 and the second electrode 13 has a ferroelectric characteristic. Due to this, an electric dipole is spontaneously aligned by carrying out a polarization process on the ferroelectric layer 12 and the ferroelectric layer 12 polarizes spontaneously by entering a ferroelectric state. Here, the direction of the polarization is, for example, inverted according to electric fields from outside.

It is also possible to configure the ferroelectric layer 12, for example, as a p-type semiconductor. Due to this, it is possible to configure the second electrode 13 as the n-type semiconductor and to form the pn junction 14 between the ferroelectric layer 12 and the second electrode 13. In this case, from the point of view of efficient photoelectric conversion, it is possible to polarize the ferroelectric layer 12 in a direction (a direction in which the induced dipole of the ferroelectric layer 12 induces a positive charge on the side of the second electrode 13 which is an n-type semiconductor) in which a negative bias is applied to the second electrode 13.

Here, it is also possible to configure the ferroelectric layer 12 as the n-type semiconductor and the second electrode 13 is configured as the p-type semiconductor in such a case. In this case, from the point of view of efficient photoelectric conversion, it is possible to polarize the ferroelectric layer 12 in a direction (a direction in which the induced dipole of the ferroelectric layer 12 induces a negative charge on the side of the second electrode 13 which is a p-type semiconductor) in which a positive bias is applied to the second electrode 13.

It is possible to carry out the polarization process by applying a predetermined polarization voltage to the ferroelectric layer 12. Here, the polarization voltage refers to the voltage which is able to cause spontaneous polarization in the ferroelectric layer 12 and includes, for example, a voltage which generates spontaneous polarization in ferroelectric materials where the orientation of the electric dipole is random and which are in a default state without any bias charge as a whole, or a voltage for inverting the polarization direction of the ferroelectric material which is already generated. It is possible to determine the voltage value and the application conditions of the polarization voltage, for example, according to test results or the like in consideration of the ferroelectric material.

The spontaneous polarization is held in the ferroelectric layer 12 by carrying out the polarization process. Due to this, as shown in FIG. 1A, it is possible to realize a photoelectric conversion element 10A with a simple configuration and diversification of the configuration is easy, whereby use in a wide range of applications is easy.

On the other hand, as shown in FIG. 1B, a photoelectric conversion element 10B may be configured by further providing a polarization processing circuit 20 for carrying out a polarization process on the ferroelectric layer 12. Due to this, it is possible to apply a polarization voltage to the ferroelectric layer 12 as necessary. Thus, for example, it is easy to apply the polarization voltage to the ferroelectric layer 12 at desired intervals and reliably set the ferroelectric layer 12 to a ferroelectric state, or to adjust the polarization voltage which is applied and appropriately change the polarization direction of the ferroelectric layer 12. As a result, use in a wide range of applications is easy.

It is possible to configure the polarization processing circuit 20 by providing, for example, a polarization voltage applying section 21, a switching element 22 which is provided between the polarization voltage applying unit 21 and the photoelectric conversion element 10, and a control section 23 which transmits a control signal to the polarization voltage applying section 21 or the switching element 22. The switching element 22 may be omitted.

The polarization voltage applying section 21 is a portion which generates a polarization voltage and it is possible to use a power supply apparatus which is known in the art. It is possible for the switching element 22 to use a field effect transistor (TFT) or the like and one of wiring 24 and wiring 25 is connected thereto. The other wiring out of the wiring 24 and the wiring 25 is connected with the first electrode 11 and the second electrode 13.

The control section 23 is configured centered around a microcomputer which is known in the art and is configured so as to transmit a control signal to the polarization voltage applying section 21 or the switching element 22 and to control the voltage value or the application time of the polarization voltage.

According to the polarization processing circuit 20, as described above, it is possible to apply a polarization voltage to the ferroelectric layer 12 as necessary. The configuration of the polarization processing circuit 20 is not limited within a range which does not depart from the scope of the invention.

In addition, it is possible to configure the ferroelectric layer 12 so as to include bismuth (Bi) and iron (Fe). Due to this, it is possible to configure the ferroelectric layer 12 as a composite oxide with a perovskite structure which contains Bi and Fe. That is, typically, it is possible to configure the ferroelectric layer 12 as a ferric acid bismuth based composite oxide with a perovskite structure. Since such a composite oxide does not include lead for which the burden on the environment is a concern, it is possible to realize the photoelectric conversion element 10 to be able to reduce the burden on the environment.

The composite oxide with a perovskite structure makes an octahedron by the oxygen coordination number being 12 in the A site and the oxygen coordination number being 6 in the B site. A composite oxide with a perovskite structure where a part of Bi in the A site and Fe in the B site is replaced with various types of chemical elements may be used.

For example, it is preferable that the ferroelectric layer 12 include at least one type which is selected from a group consisting of lanthanum (La), manganese (Mn), and titanium (Ti). Due to this, for example, it is possible to improve the photoelectric conversion function in a non-lead based material and more efficient photoelectric conversion is possible. In addition, it is also possible to increase the degree of freedom in the material which configures the ferroelectric layer 12.

In detail, La is an example of a chemical element which replaces Bi in the A site and Mn is an example of a chemical element which replaces Fe in the B site. Such a composite oxide is referred to as bismuth lanthanum ferrate manganate (BLFM) and is represented by the following compositional formula (1).

(1)

(In the formula, x and y all have a value which is greater than 0 and smaller than 1.)

In addition, in BLFM, Fe in the B site of the ferroelectric layer 12 may be replaced with Ti. Such a composite oxide is represented by the following compositional formula (2).

(2)

(In the formula, x, y, and z both have a value which is greater than 0 and smaller than 1.)

However, without limiting the configuration of the ferroelectric layer 12 to the example, Bi in the A site of the ferroelectric layer 12 may be replaced with samarium (Sm), cerium (Ce), or the like and Fe in the B site may be replaced with aluminum (Al), cobalt (Co), or the like. Even in a case of a composite oxide which includes other chemical elements, it is preferable that the composite oxide have a perovskite structure.

That is, examples of the ferroelectric layer 12 include bismuth ferrate oxide ($BiFeO_3$), bismuth ferrate aluminum oxide ($Bi(Fe,Al)O_3$), bismuth ferrate manganese ($Bi(Fe,Mn)O_3$), bismuth lanthanum ferrate manganese oxide (($Bi,La$)($Fe,Mn$)$O_3$), bismuth ferrate cobalt oxide ($Bi(Fe,Co)O_3$), bismuth cerium ferrate oxide (($Bi,Ce$)$FeO_3$), bismuth cerium ferrate manganese oxide (($Bi,Ce$)($Fe,Mn$)$O_3$), bismuth lanthanum cerium ferrate oxide (($Bi,La,Ce$)$FeO_3$), bismuth lanthanum cerium ferrate manganese oxide (($Bi,La,Ce$)($Fe,Mn$)$O_3$), bismuth samarium ferrate oxide (($Bi,Sm$)$FeO_3$), bismuth chromium ferrate oxide ($Bi(Cr,Fe)O_3$), and the like.

Figure 2A:
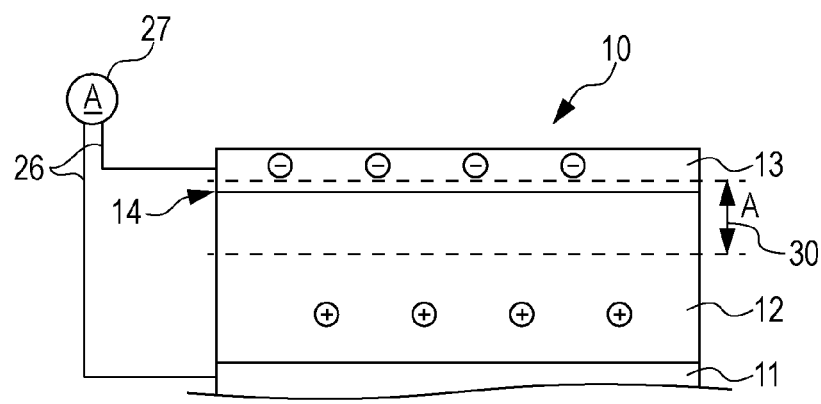
FIGS. 2A and 2B are diagrams which illustrate an operation and the like of the photoelectric conversion element according to Embodiment 1.
Figure 2B:
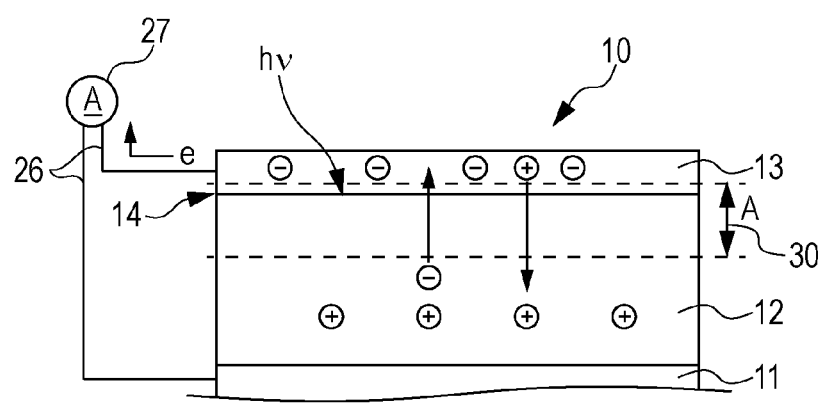
Figure 3A:
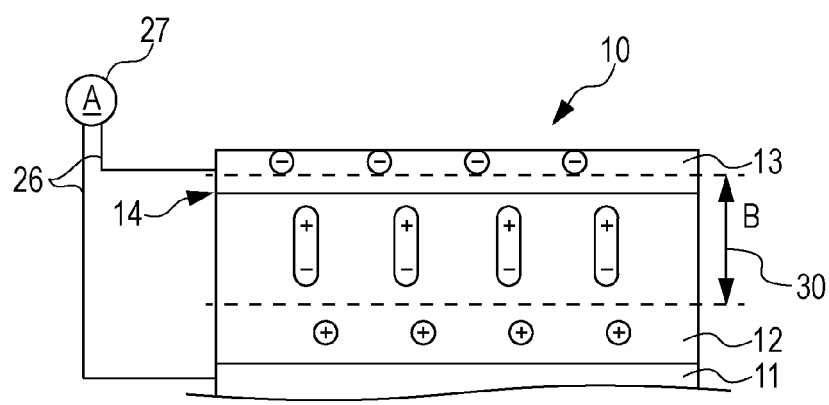
FIGS. 3A and 3B are diagrams which illustrate an operation and the like of the photoelectric conversion element according to Embodiment 1.
Figure 3B:
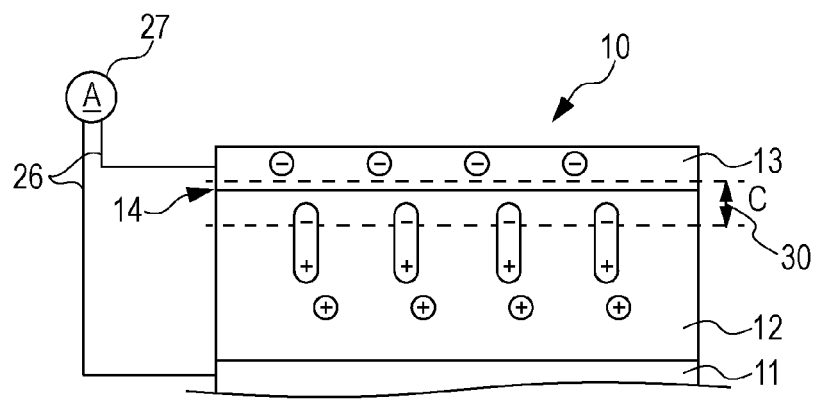

Here, description will be given of an operation or a function which relates to the photoelectric conversion element 10 of the present embodiment using FIGS. 2A and 2B and FIGS. 3a and 3B. FIGS. 2A and 2B and FIGS. 3A and 3B are enlarged diagrams which show the vicinity of the pn junction 14 of the photoelectric conversion element 10. Out of these, FIGS. 2A and 2B are diagrams which illustrate a basic operation and function of the photoelectric conversion element 10 and FIGS. 3A and 3B are diagrams which illustrates a unique operation and function in the present embodiment.

As shown in FIG. 2A, in a case of forming the pn junction 14 by bonding the p-type semiconductor and the n-type semiconductor, positive holes of the p-type semiconductor move to the n-type semiconductor side and electrons of the n-type semiconductor move to the p-type semiconductor side due to an internal electric field where the p-type semiconductor is positive and the n-type semiconductor is negative. As a result, a depletion layer with a predetermined width A where carriers (positive holes or electrons) are hardly present is formed in the vicinity of the pn junction.

Then, as shown in FIG. 2B, for example, when light hv is irradiated from the n-type semiconductor side which is a transparent electrode (ITO), the light hv is transmitted through the n-type semiconductor, reaches the pn junction 14, is absorbed in the n-type semiconductor or the p-type semiconductor, and carriers are generated. For the carriers which are generated, the electrons move to the n-type semiconductor side and the positive holes move to the p-type semiconductor side due to the internal electric field which is formed by the p-type semiconductor and the n-type semiconductor. Due to this, a photoelectric current e is generated.

Here, to detect the photoelectric current e, a current detector 27 which is known in the art may be connected with each of the first electrode 11 and the second electrode 13, for example, via wiring 26.

The depletion layer 30 is a portion which influences the pn junction diode characteristic of the photoelectric conversion element 10 and when the depletion layer 30 expands, the capacitance is reduced and electrical output with high linearity with respect to the illuminance of light is obtained. As a result, it is an advantage for the photoelectric conversion element 10 to be highly sensitive.

Here, as shown in FIG. 3A, a polarization process is carried out on the ferroelectric layer 12 of the present embodiment in a direction in which a negative charge is induced on the side of the ferroelectric layer 12 which is a p-type semiconductor and a positive charge is induced on the side of the second electrode 13 which is an n-type semiconductor. Due to this, a state is obtained where an electric field which is oriented downward (an orientation from the second electrode 13 side to the ferroelectric layer side) is applied in the vicinity of the pn junction 14 and the expanded depletion layer 30 is obtained (width B shown in FIG. 3A>width A shown in FIG. 2A).

In other words, according to the present embodiment, it is possible to obtain the same type of effect as applying a reverse bias from the point of view of expanding the width of the depletion layer 30. Then, it is possible to avoid the generation of a dark current which is generated under operation conditions with reverse bias without a small number of carriers, which are present in both sides of the p-type semiconductor and the n-type semiconductor of the depletion layer 30, being diffused in the depletion layer 30.

As a result, according to the photoelectric conversion element 10 of the present embodiment, it is possible to change the polarization direction and to change the pn junction diode characteristic by using the ferroelectric characteristic of the ferroelectric layer 12 and due to this, more efficient photoelectric conversion is possible. Then, since the ferroelectric layer 12 has both a satisfactory ferroelectric characteristic and a satisfactory pn junction diode characteristic, it is possible to provide the photoelectric conversion element 10 so as to be able to be used in a wide range of applications.

Here, as shown in FIG. 3B, when the polarization process is carried out in the direction in which a positive charge is induced on the side of the ferroelectric layer 12 which is a p-type semiconductor and a negative charge is induced on the side of the second electrode 13 which is an n-type semiconductor, a state is obtained where an electric field which is oriented upward (an orientation from the ferroelectric layer 12 side to the second electrode 13 side) is applied in the vicinity of the pn junction 14 and the contracted depletion layer 30 is obtained (width C shown in FIG. 3B<width A shown in FIG. 2A).

In this manner, according to the photoelectric conversion element 10 of the present embodiment, it is possible to realize the photoelectric conversion element 10 so as to be able to exhibit a function with either of high sensitivity or low sensitivity by using the feature that the ferroelectric layer 12 has both a satisfactory ferroelectric characteristic and a satisfactory pn junction diode characteristic.

Next, description will be given of an example of a method of manufacturing the photoelectric conversion element 10 of the present embodiment with reference to FIGS. 4A to 4D. FIGS. 4A to 4D are cross sectional diagrams which show a manufacturing example of the photoelectric conversion element 10.

Figure 4A:
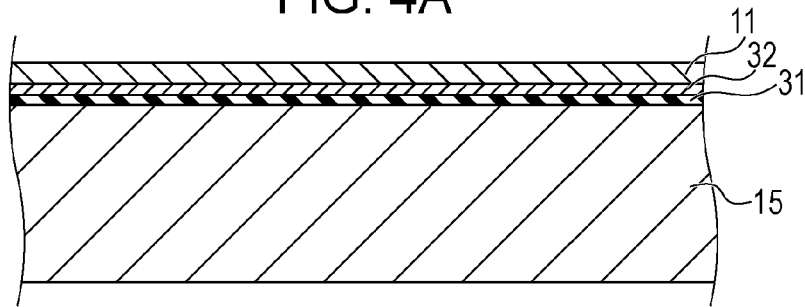
FIGS. 4A to 4D are diagrams which illustrate a manufacturing example of the photoelectric conversion element according to Embodiment 1.

As shown in FIG. 4A, a silicon dioxide ($SiO_2$) film which functions as an insulation layer 31 is formed by thermal oxidation or the like on the silicon (Si) substrate 15 and an adhesion layer 32 formed of titanium oxide or the like is formed by a sputtering method, thermal oxidation, or the like on the silicon dioxide film. Then, the first electrode 11 formed of platinum, iridium, iridium oxide, a laminated structure thereof, or the like is formed by a sputtering method, a vapor deposition method, or the like on the whole surface of the adhesion layer 32. Here, the insulation layer 31 or the adhesion layer 32 may be omitted.

Figure 4B:
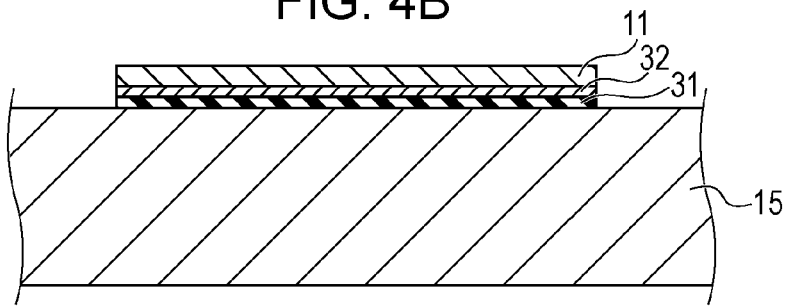

Next, as shown in FIG. 4B, patterning is carried out on the insulation layer 31, the adhesion layer 32, and the first electrode 11 at the same time by setting a resist (which is not shown in the diagram) with a predetermined shape as a mask on the first electrode 11 which is formed.

Next, the ferroelectric layer 12 is laminated on the first electrode 11. The method of manufacturing the ferroelectric layer 12 is not particularly limited; however, for example, it is possible to manufacture the ferroelectric layer 12 using a chemical solution method such as a Metal-Organic Decomposition (MOD) method where a film of a ferroelectric body formed of metal oxide is obtained by coating and drying a solution which includes metallic complex and further carrying out sintering at a high temperature, or a sol-gel method. Other than these, it is also possible to manufacture the ferroelectric layer 12 using either a liquid phase method or a solid phase method such as a laser ablation method, a sputtering method, a pulse laser deposition method (a PLD method), a chemical vapor deposition method, and an aerosol deposition method.

Figure 4C:
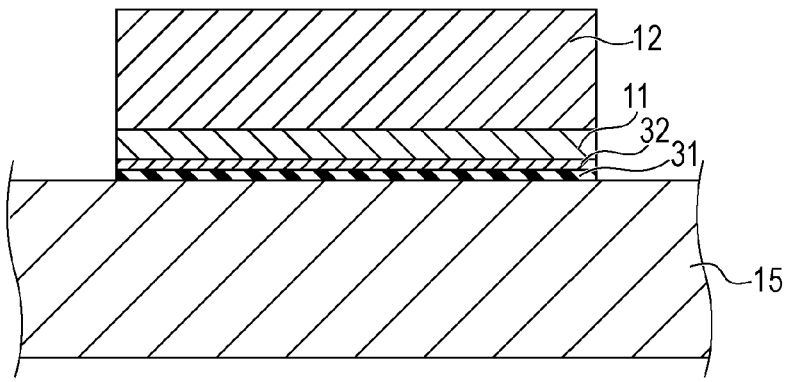

In detail, a precursor film is formed by coating a precursor solution for forming the ferroelectric layer 12 on the first electrode 11 by using a spin coating method or the like (a coating process) and the precursor film is dried for a certain time by being heated to a predetermined temperature (for example, 150 to 200° C.) (a drying process). Next, grease is removed by heating the dried precursor film to a predetermined temperature (for example, 350 to 450° C.) and holding the film for a certain time (a grease removing process), and then the precursor film is crystallized by heating the precursor film to a predetermined temperature (for example, 600 to 850° C.) and holding the film for, for example, 1 to 10 minutes (a sintering process). Due to this, as shown in FIG. 4C, the ferroelectric layer 12 formed of, for example, a composite oxide which has a perovskite structure which includes Bi and Fe is formed on the first electrode 11.

Figure 4D:
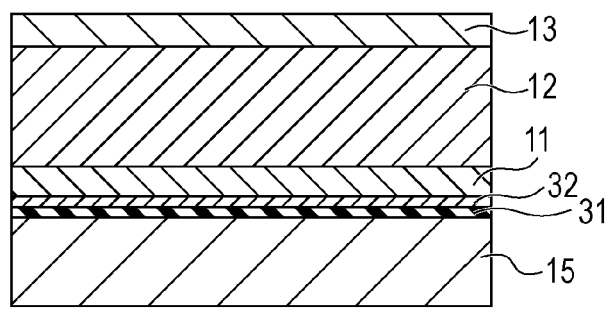

Next, as shown in FIG. 4D, the photoelectric conversion element 10 formed of the first electrode 11, the ferroelectric layer 12, and the second electrode 13 is formed by forming the second electrode 13 as a transparent electrode (ITO) formed of indium tin oxide or the like on the ferroelectric layer 12 which is formed using a sputtering method or the like and carrying out patterning on the ferroelectric layer 12 and the second electrode 13 at the same time as necessary. In addition, the substrate 15 may be thinned to a predetermined thickness or unnecessary portions may be cut off by dicing or the like. It is possible to perform annealing at a predetermined temperature (for example, 600 to 850° C.) as necessary. Due to this, it is possible to form a favorable interface between the ferroelectric layer 12 and the first electrode 11 or the second electrode 13 and it is possible to improve the crystallinity of the ferroelectric layer 12.

Embodiment 2

Figure 5:
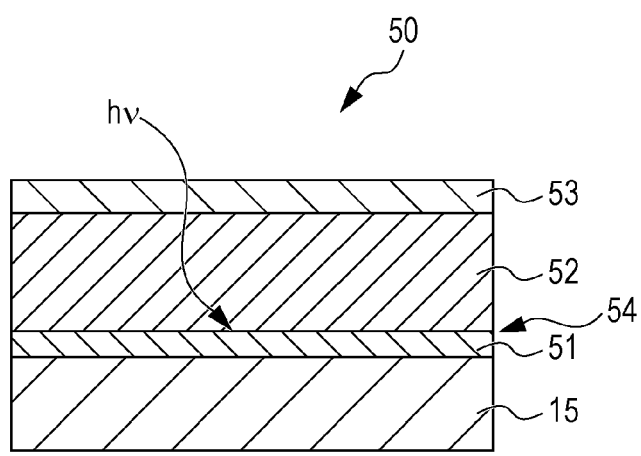
FIG. 5 is a diagram which shows a schematic configuration of a photoelectric conversion element according to Embodiment 2.

FIG. 5 is a diagram which shows a schematic configuration of the photoelectric conversion element according to Embodiment 2 of the invention.

As shown in the diagram, in a photoelectric conversion element 50 of the present embodiment, a second electrode 53 is a transparent electrode and a pn junction 54 is formed between a ferroelectric layer 52 and a first electrode 51.

Also in the present embodiment, the first electrode 51, the ferroelectric layer 52, and the second electrode 53 are laminated on the substrate 15 in this order. For the substrate 15, it is possible to use, for example, a silicon (Si) substrate or a glass substrate without being limited to these examples.

It is possible to configure the first electrode 51 so as to have a function as an n-type semiconductor, for example, by adding a small amount of a desired group 5 element as a donor. Due to this, in a case where the ferroelectric layer 52 is configured as a p-type semiconductor, the pn junction 54 is formed between the first electrode 51 and the ferroelectric layer 52.

However, it is also possible to configure the first electrode 51 so as to have a function as a p-type semiconductor, for example, by adding a small amount of a desired group 3 element as an acceptor. In this case, it is possible to configure the ferroelectric layer 52 as an n-type semiconductor.

It is possible to configure the second electrode 53 as a transparent electrode in the same manner as Embodiment 1. Here, the second electrode 53 of the present embodiment is not necessarily provided with a function as an n-type semiconductor or a p-type semiconductor and the degree of freedom in the design of the second electrode is high compared to Embodiment 1.

Here, the ferroelectric layer 52 is configured using a material which has a ferroelectric characteristic and transparency. Due to this, light which is transmitted through the second electrode 53 is further transmitted through the ferroelectric layer 52 and reaches the pn junction 54 which is formed between the ferroelectric layer and the first electrode 51. Here, examples of a ferroelectric material which has transparency include the compositional formula (1) or compositional formula (2) described above and composite oxides of these such as lead titanate ($PbTiO_3$), lead zirconate titanate ($Pb(Zr,Ti)O_3$; PZT), potassium niobate ($KNbO_3$), sodium niobate ($NaNbO_3$), bismuth titanate sodium ($(Bi,Na)TiO_3$; BNT), and bismuth potassium titanate ($(Bi,K)TiO_3$; BKT).

In a case where the ferroelectric layer 52 is configured as a p-type semiconductor, from the point of view of efficient photoelectric conversion, it is possible to polarize the induced dipole of the ferroelectric layer 52 in a direction in which a negative charge is induced on the side of the first electrode 51 which is an n-type semiconductor.

Here, in a case where the ferroelectric layer 52 is configured as an n-type semiconductor, from the point of view of efficient photoelectric conversion, it is possible to polarize the induced dipole of the ferroelectric layer 52 in a direction in which a positive charge is induced on the side of the first electrode 51 which is a p-type semiconductor.

Although omitted in the diagram, it is also possible for the photoelectric conversion element 50 of the present embodiment to be further provided with the polarization processing circuit 20.

Since the pn junction 54 is also formed between the ferroelectric layer 52 and the first electrode 51 in the photoelectric conversion element 50 described above, the ferroelectric layer 52 has both a satisfactory ferroelectric characteristic and a satisfactory pn junction diode characteristic. Due to this, it is possible to change the polarization direction using the ferroelectric characteristic of the ferroelectric layer 52 and to change the pn junction diode characteristic, and efficient photoelectric conversion is possible according to the polarization direction of the ferroelectric layer 52. In addition, in this aspect, since the ferroelectric layer 52 has both a satisfactory ferroelectric characteristic and a satisfactory pn junction diode characteristic, it is possible to provide the photoelectric conversion element 50 so as to be able to be used in a wide range of applications.

EXAMPLES

Example

Solution Preparation

A BLFMT precursor solution for forming the ferroelectric layer 12 was prepared by the following procedure. Firstly, propanoic acid was measured out into a beaker and acetic acid bismuth, lanthanum acetate, ferrous acetate, manganese acetate, and tetraisopropoxy titanium were mixed therewith at a molar ratio of 80:20:96:1:3. Next, after heating and stirring on a hot plate at 140° C. for one hour, the BLFMT precursor solution was prepared by being adjusted to 0.3 mol/L of propanoic acid.

Photoelectric Conversion Element Production

The first electrode 11 was formed by forming a silicon dioxide film as the insulation layer 31 on the surface of the six inch silicon (Si) substrate 15 by thermal oxidation and laminating aluminum nitride titanium, iridium, iridium oxide, and platinum on the silicon dioxide film.

The BLFMT precursor solution described above was coated on the first electrode 11 at 1500 rpm by a spin coating method. Next, the BLFMT precursor solution was heated at 350° C. for three minutes after being heated at 180° C. for two minutes on a hot plate. After repeating this coating and heating processes four times, the BLFMT precursor solution was heated at 650° C. for five minutes under nitrogen using Rapid Thermal Annealing (RTA). The ferroelectric layer 12 was formed by repeating the series of processes two times.

The second electrode 13 formed of indium tin oxide (ITO) was formed on the ferroelectric layer 12 by using a metal through mask by a sputtering method. The photoelectric conversion element of Example 1 was produced as described above.

Comparative Example

The photoelectric conversion element of Comparative Example 1 was produced by the same method as Example 1 except that the second electrode was platinum.

Pn Junction Diode Characteristic

For each of the photoelectric conversion elements of Example 1 and Comparative Example 1, a relationship (J-E curve) between a current density J ($\mu$A/cm$^2$) and a voltage E (V) was determined in a state where outside light was blocked off in the atmosphere (humidity 40% to 50%) using "4140B" manufactured by Hewlett-Packard Company.

Figure 6:
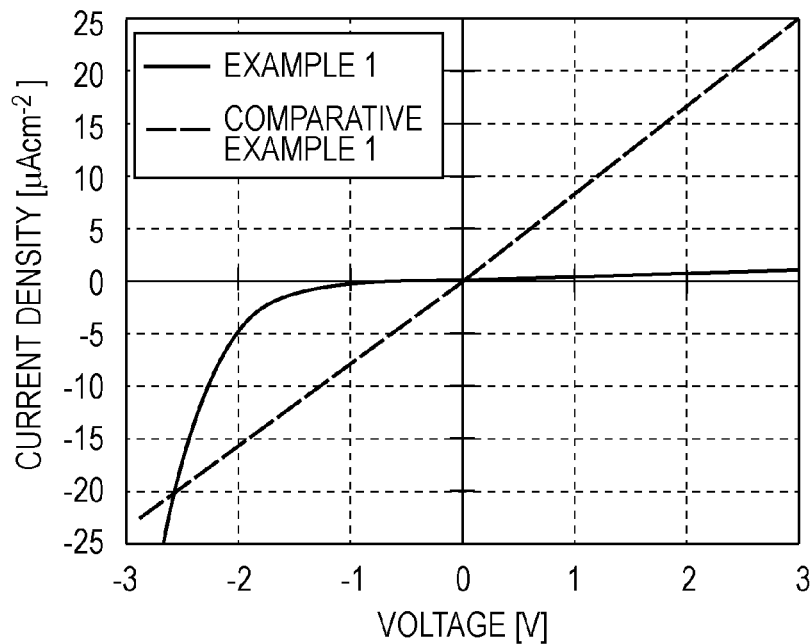
FIG. 6 is a diagram which shows a relationship between current density (J) and voltage (E).

FIG. 6 shows the J-E curve. While a characteristic of an ohmic bond where a current density J is directly proportional to a voltage E was observed in the photoelectric conversion element of Comparative Example 1 which is indicated with dotted lines, a particular characteristic was observed in a pn junction diode where it is easy for a current to flow in only one direction, for example, a negative voltage direction in the photoelectric conversion element 10 of Example 1 which is indicated with solid lines. Then, it was clear that the ferroelectric layer 12 was a p-type semiconductor and the second electrode, that is, a transparent electrode (ITO) was an n-type semiconductor in the photoelectric conversion element 10 of Example 1 according to the pn junction diode characteristic shown in FIG. 6.

In addition, from the fact that the photoelectric conversion element 10 of Example 1 was produced in the same manner as the photoelectric conversion element 10 of Comparative Example 1 apart from the second electrode 13 and from the result shown in FIG. 6, it is understood that the pn junction diode characteristic which was observed in the photoelectric conversion element 10 of Example 1 was caused by the second electrode 13 which is an n-type semiconductor.

P-E Loop Measurement

For each of the photoelectric conversion elements of Example 1 and Comparative Example 1, a relationship (P-E loop) between a polarization amount P ($\mu$C/cm$^2$) and a voltage E (V) was determined by using "FCE-1A" manufactured by TOYO Corp., utilizing an electrode pattern where $\phi$=500 $\mu$m, and applying a triangular waveform with a 1 kHz frequency at room temperature.

Figure 7:
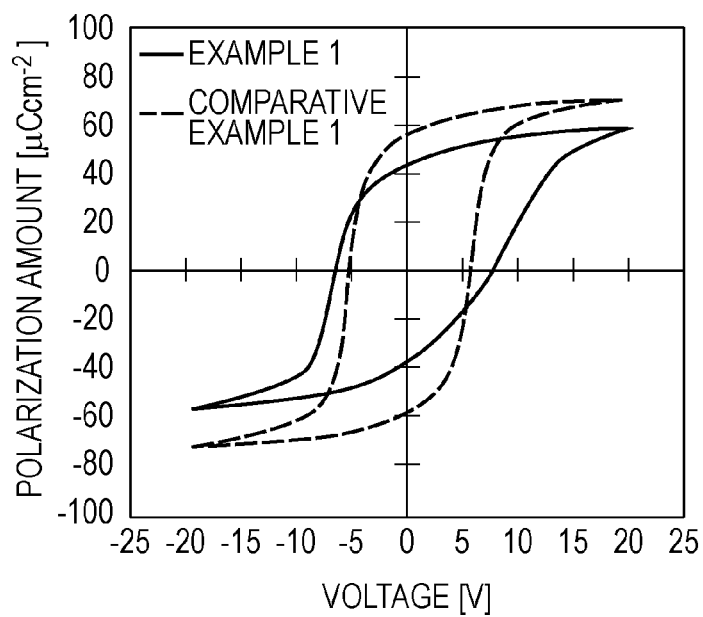
FIG. 7 is a diagram which shows a relationship between a polarization amount (P) and voltage (E).

FIG. 7 shows the P-E loop. Since both the photoelectric conversion element of Comparative Example 1 which is indicated with dotted lines and the photoelectric conversion element 10 of Example 1 which is indicated with solid lines showed a characteristic hysteresis loop (hysteresis) in the ferroelectric body, it is clear that both are ferroelectric bodies and are able to hold polarization which is generated by, for example, applying a polarization voltage.

However, while ideal hysteresis with bilateral symmetry was observed in the photoelectric conversion element of Comparative Example 1 which is indicated with dotted lines, hysteresis with bilateral asymmetry was observed in the photoelectric conversion element 10 of Example 1 which is indicated with solid lines. This is because the electrical characteristics are different in a positive voltage region and a negative voltage region since the photoelectric conversion element 10 of Example 1 has the pn junction diode characteristic as described above. From this result, it is clear that the ferroelectric layer 12 has both a satisfactory ferroelectric characteristic and a satisfactory pn junction diode characteristic in the photoelectric conversion element 10 of Example 1.

Photoelectric Conversion Characteristic

For the photoelectric conversion element 10 of Example 1, the pn junction diode characteristic, in particular, the photoelectric conversion characteristic was evaluated using "FCE-1A" manufactured by TOYO Corp., and a Model 6514 Electrometer manufactured by Keithley Instruments Inc. In detail, a polarization process was performed on the ferroelectric layer 12 by using the FCE-1A and applying a unipolar triangular waveform of +20 V or −20 V with a frequency of 1 kHz at room temperature to an electrode pattern where $\phi$=500 $\mu$m. Next, a photoelectric current was measured using a picoampere meter while repeatedly turning a fluorescent light on and off under electrical potential (unavoidable circuit electrical potential) of 2 mV.

This measurement was performed both when the ferroelectric layer 12 was polarized in a downward direction where a negative charge was induced on the side of the ferroelectric layer 12 which was a p-type semiconductor and a positive charge was induced on the side of the second electrode 13 which was an n-type semiconductor and when the ferroelectric layer 12 was polarized in an upward direction where a positive charge was induced on the side of the ferroelectric layer 12 which was a p-type semiconductor and a negative charge was induced on the side of the second electrode 13 which is an n-type semiconductor.

Figure 8:
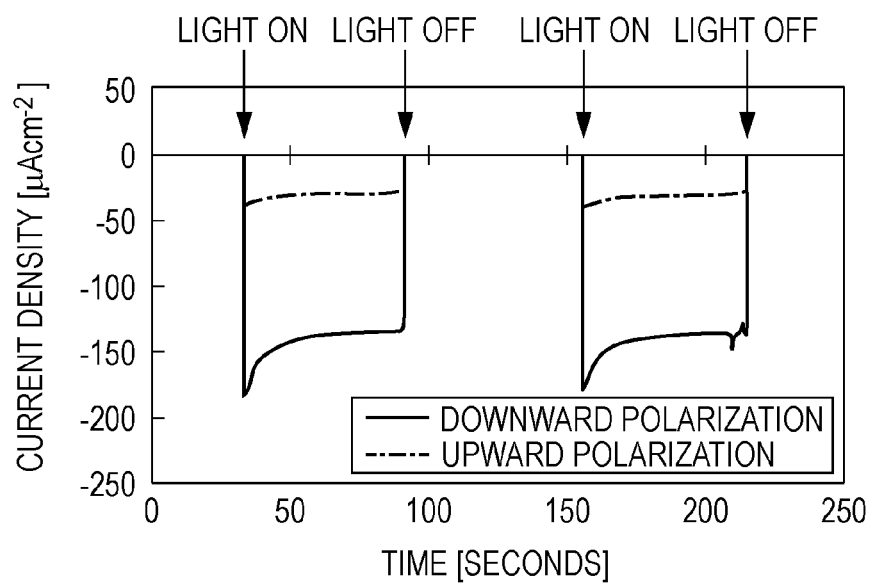
FIG. 8 is a diagram for observing a photoelectric current according to irradiation of light.

FIG. 8 shows the photoelectric conversion characteristic. As shown in the diagram, a photoelectric current was observed in the photoelectric conversion element 10 of Example 1. Due to this, it is understood that light of an irradiated fluorescent light is transmitted through the second electrode 13 which is transparent in a visible light region and reaches the depletion layer 30 and that an internal photoelectric effect is expressed.

In addition, as indicated with a dashed line, the photoelectric current which is obtained when the ferroelectric layer 12 is polarized in an upward direction is −30 nA/cm$^2$. On the other hand, as indicated with a solid line, the photoelectric current which is obtained when the ferroelectric layer 12 is polarized in a downward direction is −133 nA/cm$^2$, that is, the absolute value is approximately 4.4 times as high as the measurement result which is indicated with dashed lines.

Due to this, as shown in FIG. 3A, it is understood that a state is obtained where an electric field in the downward direction is applied to the pn junction 14 by polarizing the ferroelectric layer 12 in the downward direction, that the depletion layer 30 is expanded, and that efficient photoelectric conversion is possible.

From the result described above, it is understood that the photoelectric conversion element 10 which is provided with the first electrode 11, the ferroelectric layer 12 which is provided on the first electrode 11, and the second electrode 13 which is provided on the ferroelectric layer 12 and where the second electrode 13 is a transparent electrode and the pn junction 14 is formed between the ferroelectric layer 12 and the first electrode or the second electrode 13 is able to change a pn junction diode characteristic by using the ferroelectric characteristic of the ferroelectric layer and that due to this, efficient photoelectric conversion is possible.

Other Embodiments

One embodiment of the invention is described above. The photoelectric conversion element of the present embodiment is able to be widely used, for example, in photovoltaics including solar power generation, optical sensing systems which use optical detectors, or the like; however, the basic configuration of the photoelectric conversion element is not limited to the configuration described above.

In addition, it is possible for the photoelectric conversion element 10 of the present embodiment to be favorably used in various types of optical elements. Due to this, in a case where the ferroelectric layer 12 is configured as a p-type semiconductor, it is possible to control the carrier density of the second electrode (an n-type semiconductor) 13 which forms the pn junction 14 with the ferroelectric layer 12 according to the polarization direction of the ferroelectric layer 12. As a result, it is possible to change the optical characteristics according to the ferroelectric characteristic of the ferroelectric layer 12.

Examples of optical elements in which the photoelectric conversion element is able to be favorably used include an optical switch, a wavelength converter, an optical waveguide, a refractive index control element, an electronic shutter mechanism, a half mirror, a frequency control filter (a low-pass filter and a high-pass filter), a shielding filter for harmful rays such as infrared light, a light interference filter, an optical interferometer, an optical filter which uses a photonic crystal effect due to quantum dot formation, a photothermal conversion filter, and the like.

In addition, it is possible for the photoelectric conversion element 10 of the present embodiment to be favorably used as a ferroelectric element. Examples of ferroelectric elements which are able to be favorably used include a ferroelectric transistor (FeFET), a ferroelectric calculation circuit (FeLogic), a ferroelectric capacitor, and the like.

In addition, the photoelectric conversion element 10 of the present embodiment is also be able to be favorably used in a piezoelectric element since the photoelectric conversion element 10 exhibits a favorable piezoelectric characteristic. Examples of piezoelectric elements which are able to be favorably used include a liquid ejecting apparatus, an ultrasonic motor, an ultrasonic transmitter, an ultrasonic detector, a vibration-type dust removal apparatus, a piezoelectric transformer, an accelerometer, a pressure sensor, a piezoelectric speaker, a piezoelectric pump, and a pressure-electricity conversion device.

Furthermore, it is possible for the photoelectric conversion element 10 of the present embodiment to be favorably used in a pyroelectric element since the photoelectric conversion element 10 exhibits a favorable pyroelectric characteristic. Examples of pyroelectric elements which are able to be favorably used include a temperature detector, a biological detector, an infrared light detector, a terahertz detector, a thermoelectric converter, and the like.

It is possible to use the invention in the industrial field of photoelectric conversion elements and methods of manufacturing the same. Efficient photoelectric conversion is possible according to the invention and use in a wide range of applications is possible. In addition, when a ferroelectric material which does not contain lead is used, it is possible to reduce the burden on the environment.

The entire disclosure of Japanese Patent Application No. 2013-200462, filed Sep. 26, 2013 is expressly incorporated by reference herein.

What is claimed is:

1. A photoelectric conversion element comprising:
   a first electrode;
   a ferroelectric layer provided on the first electrode; and
   a second electrode provided on the ferroelectric layer, the second electrode being a transparent electrode,
   wherein one of the ferroelectric layer and the second electrode is configured as a p-type semiconductor, and the other one of the ferroelectric layer and the second electrode is configured as an n-type semiconductor,
   a pn junction is formed between the ferroelectric layer and the second electrode, and
   the ferroelectric layer is formed of $(Bi_{1-x}, La_x)(Fe_{1-y-z}, Mn_y, Ti_z)O_3$, where x, y and z each have a value which is greater than 0 and smaller than 1.

2. The photoelectric conversion element according to claim 1,
   wherein the ferroelectric layer is a p-type semiconductor.

3. The photoelectric conversion element according to claim 2,
   wherein an induced dipole of the ferroelectric layer is polarized with an orientation in which a positive charge is induced on the second electrode side.

4. The photoelectric conversion element according to claim 1, further comprising:
   a circuit that is configured for applying a polarization voltage to the ferroelectric layer so that an induced dipole of the ferroelectric layer is polarized in a predetermined direction.

5. A photoelectric conversion element comprising:
   a first electrode;
   a ferroelectric layer provided on the first electrode; and
   a second electrode provided on the ferroelectric layer, the second electrode being a transparent electrode,
   wherein one of the ferroelectric layer and the first electrode is configured as a p-type semiconductor, and the other one of the ferroelectric layer and the first electrode is configured as an n-type semiconductor, and a pn junction is formed between the ferroelectric layer and the first electrode, and the ferroelectric layer is formed of $(Bi_{1-x}, La_x)(Fe_{1-y-z}, Mn_y, Ti_z)O_3$, where x, y and z each have a value which is greater than 0 and smaller than 1.

6. The photoelectric conversion element according to claim 5, wherein the ferroelectric layer is a p-type semiconductor.

7. The photoelectric conversion element according to claim 6, wherein an induced dipole of the ferroelectric layer is polarized with an orientation in which a positive charge is induced on the first electrode side.

8. The photoelectric conversion element according to claim 5, further comprising:

a circuit that is configured for applying a polarization voltage to the ferroelectric layer so that the induced dipole of the ferroelectric layer is polarized in a predetermined direction.

* * * * *